(12) United States Patent
Fiordalice et al.

(10) Patent No.: US 6,218,733 B1
(45) Date of Patent: Apr. 17, 2001

(54) SEMICONDUCTOR DEVICE HAVING A TITANIUM-ALUMINUM COMPOUND

(75) Inventors: Robert W. Fiordalice, Austin; Stanley M. Filipiak, Pflugerville; Johnson Olufemi Olowolafe; Hisao Kawasaki, both of Austin, all of TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 08/254,854

(22) Filed: Jun. 6, 1994

Related U.S. Application Data

(62) Division of application No. 08/024,042, filed on Mar. 1, 1993, now Pat. No. 5,358,901.

(51) Int. Cl.[7] .................................................. H01L 23/48
(52) U.S. Cl. ........................ 257/751; 257/758; 257/764; 257/771
(58) Field of Search ................................. 257/764, 765, 257/768, 771, 751, 758, 763

(56) References Cited

U.S. PATENT DOCUMENTS

| | | | |
|---|---|---|---|
| 4,884,123 | 11/1989 | Dixit et al. ............................. | 357/71 |
| 5,306,952 | * 4/1994 | Matsuura et al. ..................... | 257/763 |
| 5,312,775 | * 5/1994 | Fujii et al. ............................ | 437/192 |
| 5,313,101 | * 5/1994 | Harada et al. ....................... | 257/763 |
| 5,360,995 | 11/1994 | Graas ................................... | 257/751 |

FOREIGN PATENT DOCUMENTS

| | | | |
|---|---|---|---|
| 03256362 | * 11/1991 | (JP) ..................................... | 257/764 |

* cited by examiner

*Primary Examiner*—Roy Potter
(74) *Attorney, Agent, or Firm*—George R. Meyer

(57) ABSTRACT

The present invention includes a process for forming an intermetallic layer and a device formed by the process. The process includes a reaction step where a metal-containing layer reacts with a metal-containing gas, wherein the metals of the layer and gas are different. In one embodiment of the present invention, titanium aluminide may be formed on the sides of an interconnect. The process may be performed in a variety of equipment, such as a furnace, a rapid thermal processor, a plasma etcher, and a sputter deposition machine. The reaction to form the intermetallic layer is typically performed while the substrate is at a temperature no more than 700 degrees Celsius.

6 Claims, 3 Drawing Sheets

SEMICONDUCTOR DEVICE HAVING A TITANIUM-ALUMINUM COMPOUND

This is a continuation divisional of application Ser. No. 08/024,042, filed Mar. 1, 1993 now U.S. Pat. No. 5,358,901 filed on Oct. 25, 1994.

FIELD OF THE INVENTION

The present invention relates to the field of semiconductor devices, and in particular, to processes for forming an intermetallic by reacting a metal with a gas and devices formed by the process.

BACKGROUND OF THE INVENTION

An intermetallic material is a material that comprises a plurality of metallic elements. Intermetallic materials, in which one of the metallic elements is a refractory metal, are used in the aviation and aerospace industries. Refractory-metal intermetallics are sometimes used in aircraft parts because of their light weight and durability compared to other metals. In the aviation and aerospace industry, refractory-metal intermetallics are usually formed at temperatures of at least 800 degrees Celsius. Such a high temperature of formation is unacceptable for the semiconductor industry. The intermetallics are usually part of a contact, interconnect, or via and are formed relatively late in a semiconductor process flow (after a silicide layer or doped regions, such as emitter or source/drain regions, have been formed). Heating a substrate to a temperature higher than about 700 degrees Celsius is generally undesired.

Within the semiconductor industry, intermetallic materials are being investigated to examine their ability to reduce electromigration and oxidation of metals within contacts or interconnects. An example of an intermetallic used in the semiconductor industry is titanium aluminide ($TiAl_3$). Titanium aluminide may be formed by sputtering or evaporating a layer of aluminum, sputtering or evaporating a layer of titanium, and reacting the layers to form titanium aluminide. This method of forming titanium aluminide is actually a type of solid-solid reaction because one solid reacts with another solid.

Although the solid-solid reaction that forms titanium aluminide is typically performed at a temperature less than 700 degrees Celsius, the process suffers from several detriments. As used in this specification, intermetallic step coverage is defined as the thickness of the intermetallic layer at its thinnest point along the side of a patterned metal layer divided by the thickness of the intermetallic layer formed on the top of the patterned metal layer. The intermetallic step coverage is expressed as a percentage. Using the solid-solid reaction that forms titanium aluminide, the intermetallic step coverage is typically no more than 10 percent and may even reach 0 percent in which case, the titanium aluminide is not formed along all of the sides of the aluminum layer. Electromigration, oxidation, and hillock formation may not be sufficiently reduced in a lateral direction because of the lower intermetallic step coverage. The unreacted titanium may: 1) form undesired electrical connections because of etch complications, 2) have undesired reactions before forming or with subsequently formed layers that contact the unreacted titanium, or 3) complicated a subsequent patterning step during the formation of interconnects.

SUMMARY OF THE INVENTION

The present invention includes a process for forming an intermetallic layer by reacting a metal layer over a substrate with a metal-containing gas, wherein the metals in the layer and the gas are different. The present invention also includes a device formed using the process. In one embodiment, a titanium aluminide layer is formed by reacting an aluminum-containing layer with titanium tetrachloride, which is a gas during the reaction. The gas allows the titanium aluminide layer to be formed on exposed sidewalls of a patterned aluminum-containing layer. Different embodiments of the invention may use a furnace, a rapid thermal processor, a plasma etcher, or a sputter deposition machine for a reactor. An embodiment of the present invention forms an intermetallic layer formed while the substrate is at a temperature no higher than 700 degrees Celsius during the reaction.

Other features and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION OF THE EMBODIMENTS

The present invention includes a process for forming an intermetallic layer by reacting a metal layer over a substrate with a metal-containing gas, wherein the metals in the layer and the gas are different. The present invention also includes a device formed using the process. Embodiments of the invention describe the use of the invention in a furnace, a rapid thermal processor, a plasma etcher, or a sputter deposition machine. The intermetallic layer is typically formed while the substrate is at a temperature no higher than 700 degrees Celsius. Two examples are described immediately below. Benefits, fabricating options, and general reactions are described later in the specification.

EXAMPLE 1

Figure 1:
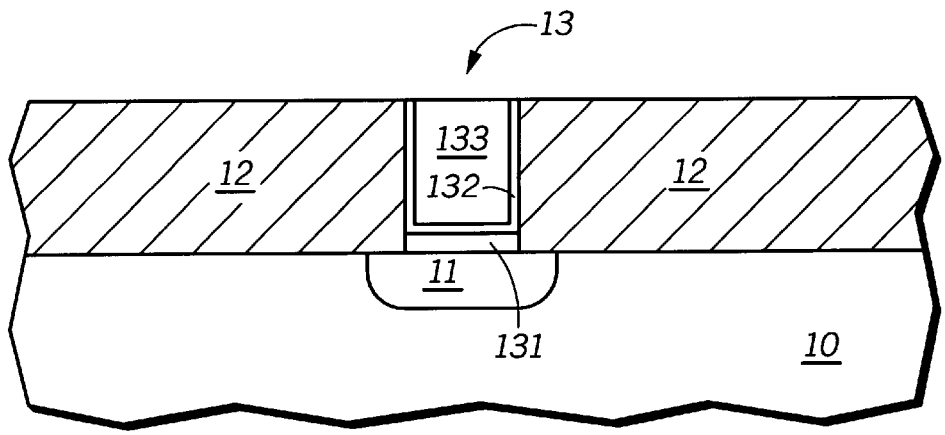
FIGS. 1–3 each include cross-sectional views of a portion of a substrate at various process steps in forming a titanium aluminide layer in accordance with one embodiment of the present invention.
Figure 2:
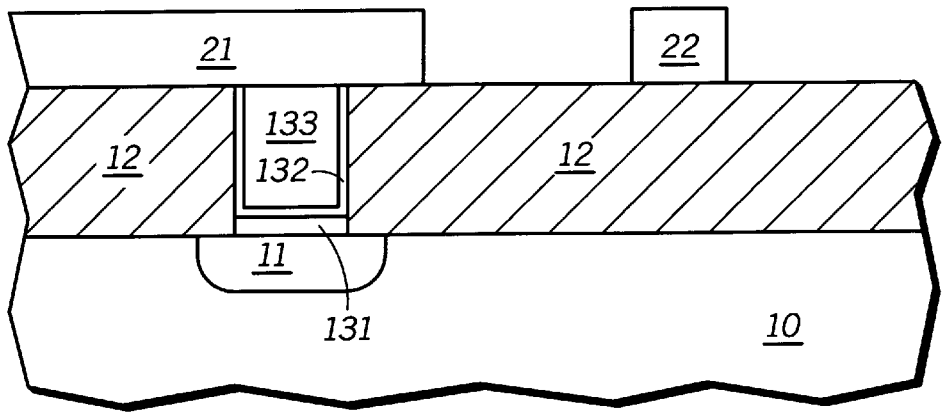

FIG. 1 includes a cross-sectional view of a semiconductor substrate prior to forming an interconnect. A doped region 11 lies within a silicon substrate 10. A patterned insulating layer 12 lies over the substrate and includes a contact plug 13 to the doped region 11. The contact plug 13 includes a titanium silicide layer 131, a titanium nitride layer 132, and a tungsten layer 133. A metal layer is deposited on the insulating layer 12 and the contact plug 13 by a sputter deposition process. The metal layer is about 98 weight percent aluminum with about 1 weight percent silicon and about 1 weight percent copper. The metal layer is patterned to form interconnects 21 and 22 as shown in FIG. 2.

Figure 3:
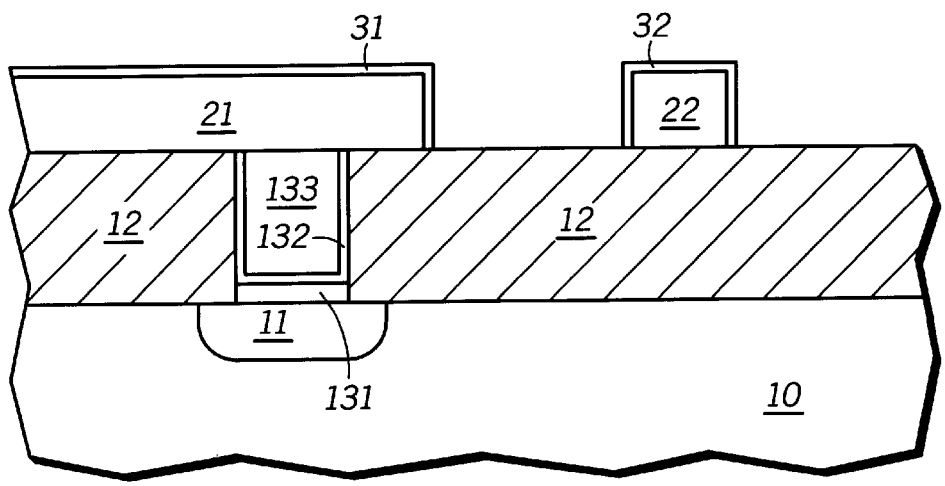

The substrate including the interconnects 21 and 22 are placed into a rapid thermal processor (RTP). The RTP is pumped down to evacuate the reaction chamber of the RTP. After being pumped down, the temperature of the reaction chamber is adjusted to about 375 degrees Celsius. The substrate becomes about the same temperature as the reaction chamber prior to performing the reaction. Gases including titanium tetrachloride (TiCl$_4$) at about 10 standard cubic centimeters per minute (SCCM), hydrogen (H$_2$)at about 100 SCCM, and argon (Ar) at about 20 SCCM are introduced into the reaction chamber, and the reaction chamber pressure is adjusted to about 150 millitorr. The substrate is allowed to react with the gas at the pressure for about 45 seconds. The reaction forms titanium aluminide (TiAl$_3$) layers 31 and 32 that are each about 225 angstroms thick and are shown in FIG. 3. Aluminum chloride (AlCl$_3$) is also a product of the reaction and is a gas during the reaction. After the substrate is removed from the RTP, only the titanium aluminide layers 31 and 32 that are formed along the sides of the interconnects 31 and 32 contact the insulating layer 12. Virtually no unreacted titanium is formed on the insulating layer 12. The reactor is purged with a relatively inert gas, such as nitrogen, argon, and the like, the reactor temperature is lowered, and the pressure is allowed to reach about atmospheric pressure. The substrate is then removed from the RTP.

EXAMPLE 2

Figure 4:
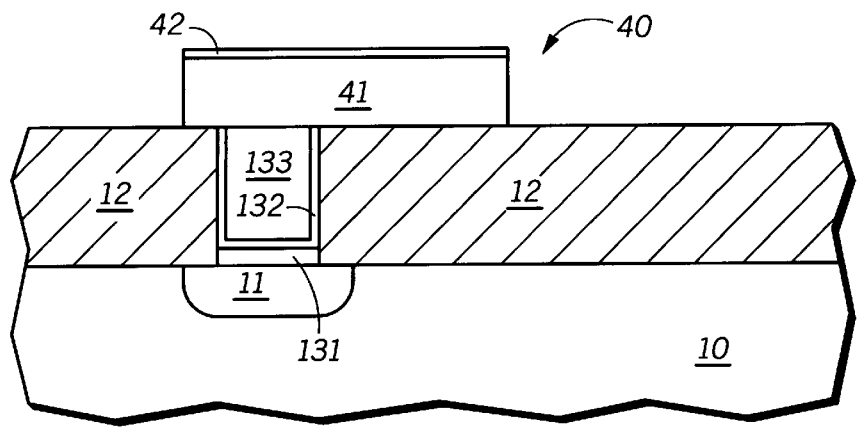
FIGS. 4–8 each include cross-sectional views of a portion of a substrate at various process steps in forming a titanium aluminide layer in accordance with another embodiment of the present invention.

In another embodiment, the titanium aluminide layer may be formed from a portion of an aluminum layer that lies at the bottom of a via opening. As shown in FIG. 4, a doped region 11 lies within a substrate 10. A patterned insulating layer 12 includes an opening with a contact plug, which includes a titanium silide layer 131, a titanium nitride layer 132, and a tungsten layer 133. After forming the contact plug, a first metal layer 41, which includes about 98 weight percent aluminum, about 1 weight percent silicon, and about 1 weight percent copper, is deposited over the patterned insulating layer 12 and the contact plug. A titanium nitride layer 42 is deposited on the first metal layer 41. The first metal and titanium nitride layers 41 and 42 are patterned to form a first-level interconnect 40 as shown in FIG. 4.

Figure 5:
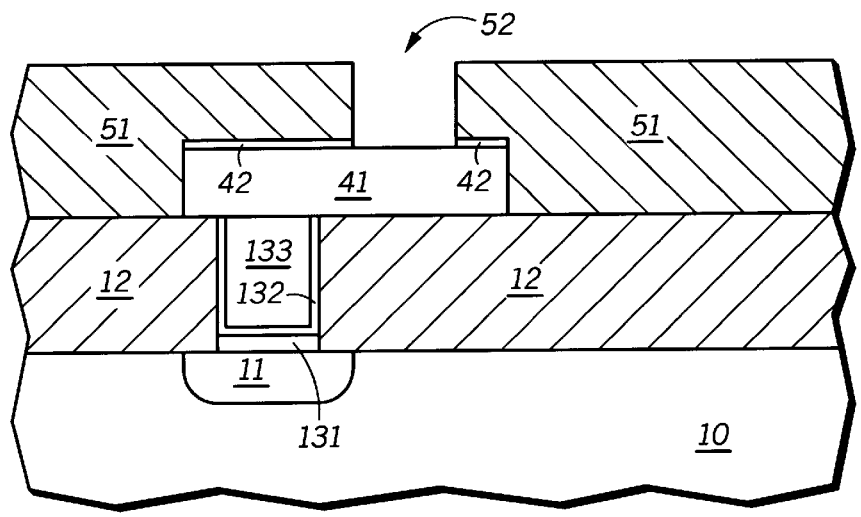

A patterned interlevel dielectric (ILD) layer 51 is formed by depositing and etching a dielectric layer. The patterned ILD layer 51 includes a via opening 52. Although the titanium nitride layer 42 should act as an etch stop during the formation of the via opening 52, some or all of the titanium nitride layer 42 is etched. FIG. 5 includes an illustration in which all of the titanium nitride layer 42 along the bottom the via opening 52 has been removed by the etch that forms the via opening 52. The metal layer 41 that lies at the bottom of the via opening 52 is exposed and may be attacked by chemicals. The first-level interconnect 40 is more susceptible to electromigration if a capping layer is not formed on the first metal layer 41.

Figure 6:
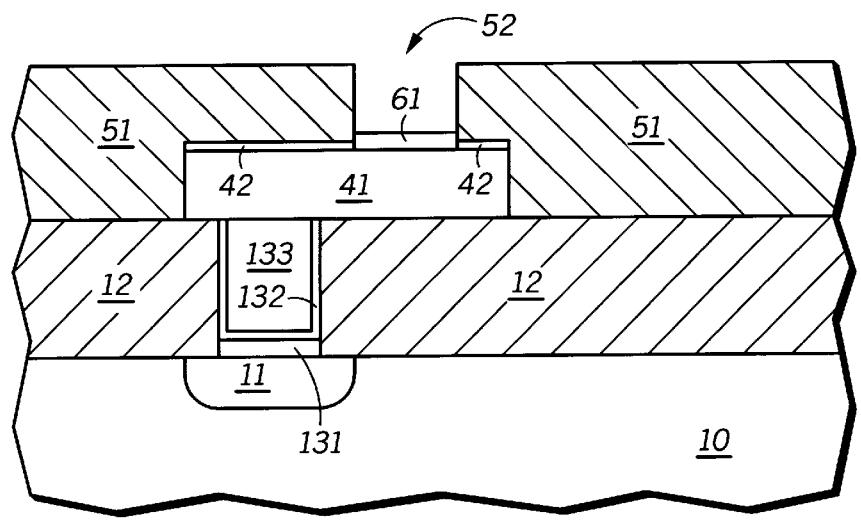

Referring to FIG. 6, the substrate including the exposed first metal layer 41 at the bottom of the via opening 52 is placed into an RTP to form a titanium aluminide layer 61 from a portion of the aluminum within the first metal layer 41 that lies at the bottom of the via opening 52. The titanium aluminide is formed at about the same conditions as listed in the embodiment of Example 1. After the substrate is removed from the RTP, the titanium aluminide layer 61 is formed only along the bottom of the via opening 52 and does not contact the ILD layer 51 except near the bottom of the via opening 52. Virtually no unreacted titanium is formed on the ILD layer 51.

Figure 7:
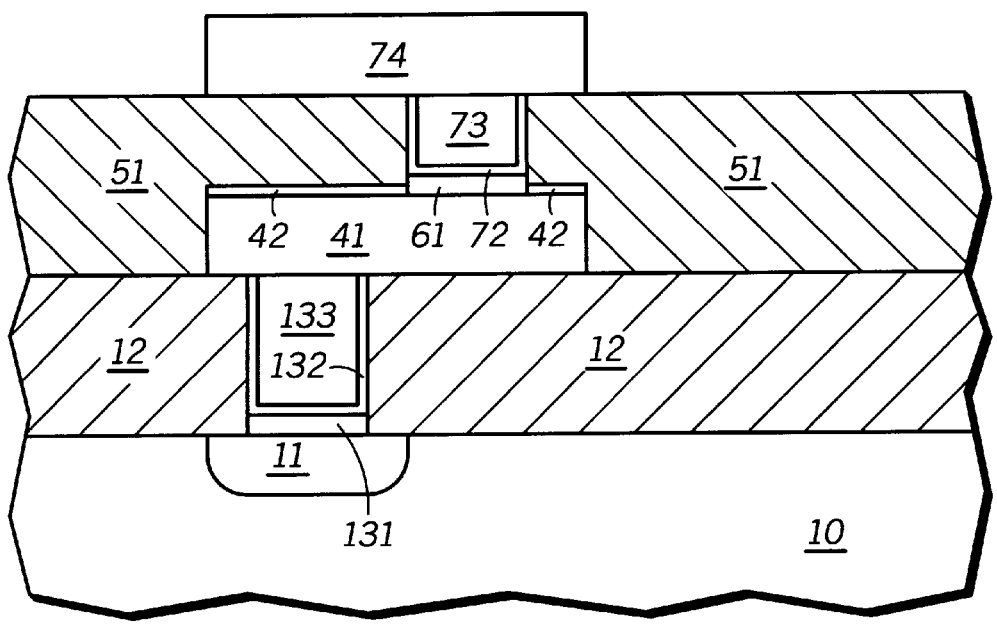
Figure 8:
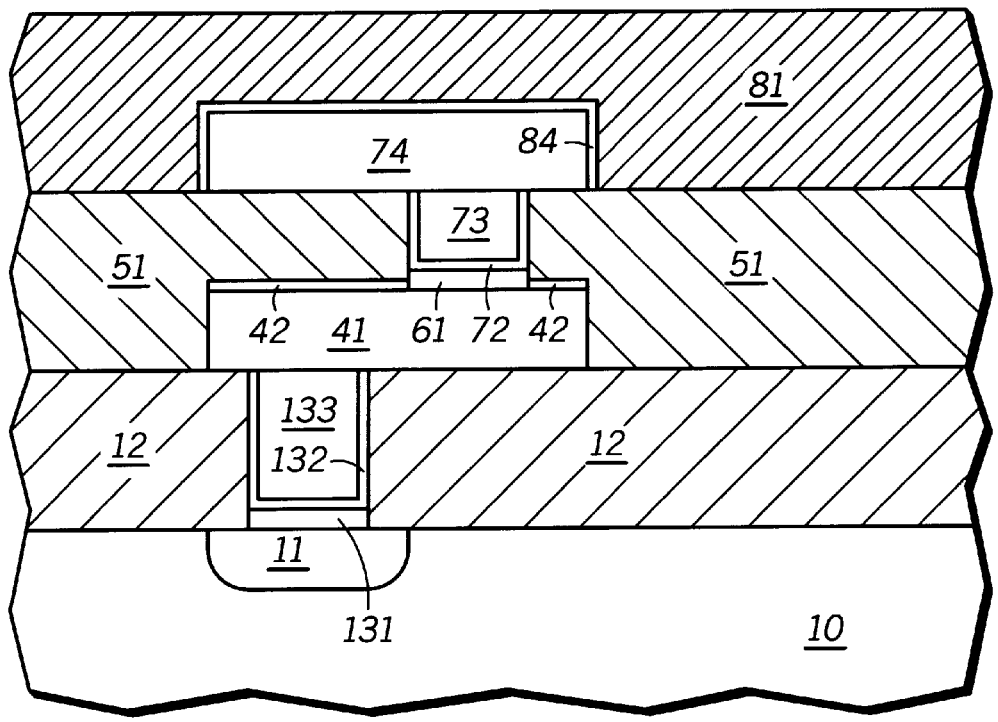

FIG. 7 includes a cross-sectional view of the semiconductor substrate after forming a second-level interconnect. The via opening 52 is filled to form a via plug. The via plug includes the previously described titanium aluminide layer 61. The ia plug further includes a titanium nitride layer 72 and a tungsten layer 73. The formation of the titanium nitride and tungsten layers 72 and 73 within the via opening 52 is performed using a conventional process. A second metal layer, which includes 98 weight percent aluminum, about 1 weight percent silicon, and about 1 weight percent copper, is deposited on the ILD layer 51 and the via plug. The second metal layer is patterned to form the second-level interconnect 74 as shown in FIG. 7. Referring to FIG. 8, the substrate is placed in an RTP and exposed to an ambient including titanium tetrachloride to form a titanium aluminide layer 84 on the second-level interconnect 74. The reaction conditions are the same as those used in the embodiment of Example 1. A passivation layer 81 is formed over the titanium aluminide layer 84 and the ILD layer 51 to form a substantially completed device.

Benefits and Fabrication Options of the Examples

The embodiments described above includes many benefits. Titanium aluminide helps to reduce electromigration and is more oxidation resistant compared to aluminum, titanium, and other titanium-containing compounds. The titanium aluminide is formed by reacting gaseous titanium tetrachloride with aluminum in the interconnect without sputtering or evaporating titanium. Therefore, titanium aluminide is formed on all exposed surfaces of the interconnect, which includes the sides. The intermetallic step coverage may be about 100 percent with the embodiments. As will be described later, the titanium aluminide may be formed using a plasma method. Although the plasma method may have lower intermetallic step coverage compared to the embodiments of the examples, the intermetallic step coverage is typically at least 50 percent. Hillocks may be formed in a vertical or a lateral direction. The ability to form titanium aluminide with at least 50 percent intermetallic step coverage reduces the likelihood of forming lateral hillocks compared to the solid-solid reaction that forms titanium aluminide.

The embodiments of the Examples do not form an unreacted titanium layer. The solid-solid reaction that forms titanium aluminide may have unreacted titanium remaining after the reaction. Any unreacted titanium from the solid-solid reaction that forms titanium aluminide typically needs to be removed after the reaction to form titanium aluminide. Removal of the unreacted titanium must be selected to both aluminum and titanium aluminide. Many etchants that etch titanium also etch aluminum. There is also a risk that the etchants that etch titanium also may etch titanium aluminize.

If unreacted titanium were not removed, the unreacted titanium may cause problems. The volume of aluminum and titanium before reaction is more than the volume of titanium aluminide formed by the reaction. Consider the following situation. Layers of aluminum and titanium are deposited and patterned to form an interconnect. In this example, the solid-solid reaction between the layers occurs, but not all of the aluminum and titanium layers are consumed by the solid-solid reaction. An insulating layer is placed over the interconnect. Subsequent thermal cycles may cause the unreacted titanium to further react with the aluminum layer. Because the volume of the titanium aluminide formed by the reaction is less than the volume of titanium and aluminum used in forming the titanium aluminide, the interconnect effectively shrinks in size thereby forming a void between the interconnect and the insulating layer. Aluminum layers typically have tensile stress. The presence of a void may allow the aluminum layer to peel away from the substrate, which is undesirable.

The unreacted titanium may cause other problems. If the titanium-sputter method was used to form titanium aluminide within the via opening 52 of FIG. 5, unreacted titanium probably would lie on the ILD layer 51 and on the titanium aluminide that is formed at the bottom of the via opening 52. If the unreacted titanium that lies on the titanium aluminide within the via opening 52 is not removed, the unreacted titanium may react with oxygen or air to form a titanium-oxide material, which is generally undesired. The resistance within the via plug may be too high. In addition, the unreacted titanium may react with subsequently formed layers. Therefore, the unreacted titanium may: 1) form undesired electrical connections because of etch complications, 2) have undesired reactions before forming or with subsequently formed layers that contact the unreacted titanium, or 3) complicated a subsequent patterning step during the formation of interconnects. The method of the present invention does not have the detriments of the solid-solid reaction that forms titanium aluminide. The titanium of the titanium chloride reacts with the aluminum of the interconnect, and does not form unreacted titanium over the substrate. Therefore, complications that arise due to unreacted titanium do not exist with the present invention.

Another benefit of the present invention is the variety of equipment and processing conditions that may be used to form the titanium aluminide. The reaction to form titanium aluminide may be performed in a furnace, an RTP, sputter deposition machine, or etching equipment. Specific applications using these types of equipment are described later. The aluminum source is typically a metal layer that usually has at least 95 percent aluminum and/or small amounts of silicon or copper. The metal layer may include an amount of aluminum, which is less than 95 percent. The titanium source should be a gas during the reaction with aluminum, and a compound within the gas includes titanium and typically chlorine atoms. Titanium sources may include titanium tetrachloride, titanium-chloride-halide compounds, or organotitanium compounds that have chlorine radicals. If the titanium source does not have any chlorine atoms, a chlorine-containing gas, such as molecular chlorine ($Cl_2$) may be added. The gas may consist of the titanium source or further include a non-oxidizing diluent. The non-oxidizing diluent may be hydrogen, argon, helium, nitrogen, or chlorine. When the gas includes a diluent, the titanium source usually comprises no more than about 25 volume percent of the total gas composition.

The pressure of the reaction chamber during the reaction is no higher than about atmospheric pressure. The highest pressure that may be used may depend on the titanium source. Titanium tetrachloride is a liquid at atmospheric pressure. Therefore, the reaction chamber must be under a vacuum when using titanium tetrachloride. For most applications, the pressure during reaction is no higher than about 500 millitorr. The actual flow rates of the titanium source and/or diluent depends on the reactor chamber pressure and volume. The flow rates typically are larger for higher pressures or larger volumes. The actual gas flows listed in the embodiment of Example 1 are illustrative and not limiting.

The substrate temperature during the reaction to form titanium aluminide is usually no higher than about 550 degrees Celsius. For most applications, the substrate temperature is no higher than 450 degrees Celsius. The reaction time depends on the temperature, pressure, and gas composition. Reaction times are addressed below with regards to specific applications. The thickness of the titanium aluminide formed in the embodiment of Example 1 is about 225 angstroms. The thickness of titanium aluminide using the method of the present invention has no known limits, and a titanium aluminide layer between about 2600–3000 angstroms has been formed. For most applications, the thickness of the titanium aluminide is enough to achieve a desired resistance to electromigration or oxidation and is usually no thicker than 1000 angstroms.

Applications with Various Pieces of Equipment

The embodiments of the Examples were performed using an RTP. In general, the reaction chamber when using the RTP is usually 300–450 degrees Celsius, and the reaction time is between 10–300 seconds. The substrate has about the same temperature as the reaction chamber of the RTP during the reaction. A furnace may be used for the reaction, but the furnace must be able to be evacuated to remove oxidizing species. An example of such a furnace is a chemical vapor deposition furnace that is used to deposit films, such as silicon dioxide, polysilicon, or silicon nitride. The furnace may be a single-wafer processor or a batch processor. For a single-wafer processor, the reaction conditions for the RTP may be used. Most batch processor types of furnaces are not able to perform a controlled reaction for a time in a range of 10–300 second. The batch processor types of furnace may have reaction times up to 30 minutes. For example, a batch processor type of furnace may operate with a reaction chamber temperature of about 200 degrees Celsius. The substrates are at about the same temperature as the reaction chamber. The reaction time can be adjusted to about 10 minutes at about 200 degrees Celsius by adjusting the reaction chamber pressure and the gas composition of the reaction chamber. Lower pressures and less titanium source concentration within the gas usually causes the reaction time to increase for a constant temperature.

Titanium aluminide may be formed using a plasma, which is an ionized gas. A plasma reaction may be used to form titanium aluminide. The temperature of the substrate should be about the same as it is for the RTP or furnace reaction. In an RTP or furnace, the temperature of the substrate is about the same as the reaction chamber itself. In a plasma reactor, the substrate may be placed on a susceptor that is maintained at a different temperature compared to the plasma. The substrate temperature should be adjusted to be at about the same temperature as listed above with respect to an RTP or furnace. The plasma reaction should occur at a faster rate compared to an RTP or furnace reaction performed at the same temperature. The parameters of the plasma may need to be adjusted, so that the titanium aluminide forms on both top and side surfaces of an exposed interconnect. Higher reactor pressure and lower power may be used to form titanium aluminide along the sides of an interconnect. If the titanium aluminide is not to be formed on the sides of an interconnect, the plasma does not need this type of adjusting. Equipment capable of forming a plasma include furnaces, plasma etchers, and sputter deposition machines. A plasma-enhanced deposition furnace is an example of one type of furnace that may be used.

Complications may occur with a plasma etcher, but the complications are not insurmountable. In the embodiments of the examples, patterning steps may be performed using photoresist masks. A hard mask may be used to allow the titanium aluminide reaction to occur without exposing an aluminum-containing interconnect to oxygen or air. For example, consider forming titanium aluminide on an interconnect that lies at the bottom of a via opening. After an interconnect is formed, a relatively thick silicon dioxide layer and a relatively thin silicon nitride layer are sequentially deposited over the interconnect. A photoresist mask is formed on the silicon nitride layer and includes a photoresist opening within the photoresist mask that lies over the interconnect. A silicon nitride layer opening is etched through the silicon nitride layer and the photoresist mask is removed. The silicon dioxide layer opening is etched using the silicon nitride layer as a hard mask. The silicon dioxide layer is etched in a plasma etcher to form a silicon dioxide layer opening that extends through the silicon dioxide layer to the interconnect. The combination of the silicon dioxide layer opening and the silicon nitride layer opening form a via opening. A titanium aluminide layer is formed from a portion of the aluminum in the interconnect at the bottom of the via opening after the via opening is formed and before the interconnect at the bottom of the via opening is exposed to oxygen, air, or atmospheric pressure.

A sputter deposition machine may also be used for the formation of titanium aluminide. Many types of sputter deposition machines have a plurality of chambers, which can be heated to temperatures of at least 450 degrees Celsius. A substrate is placed into the machine, and the substrate is placed under a vacuum. A metal layer including aluminum is deposited over a substrate in a first chamber using a conventional sputter deposition method. After depositing the metal layer, the substrate is moved to a second chamber without exposing the metal layer to oxygen, air, or atmospheric pressure. The reaction to form titanium aluminide is performed in the second chamber. The reaction may occur at conditions similar to those used for an RTP if the chamber can be heated, or the reaction may be a plasma reaction, wherein the plasma is directed at the substrate instead of a sputtering target.

General Reactions

Although much of the specification has focused on titanium aluminide, the present invention is not limited to titanium aluminide. The general reaction equation for the formation of the intermetallics in accordance with an embodiment of the present invention and the titanium aluminide reaction of the embodiment of Example 1 are as follows:

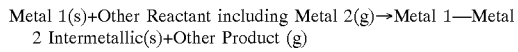
Metal 1(s)+Other Reactant including Metal 2(g)→Metal 1—Metal 2 Intermetallic(s)+Other Product (g)

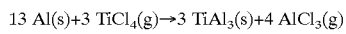
13 Al(s)+3 TiCl$_4$(g)→3 TiAl$_3$(s)+4 AlCl$_3$(g)

The phases (solids and gases) listed are the phases of the reactants and products during the reaction itself. As can be seen, the reaction to form the Metal 1-Metal 2 Intermetallic (titanium aluminide) is a type of solid-gas reaction, as opposed to a solid-solid reaction that may occur with deposition methods that include sputtering, evaporating, or chemical vapor depositing (CVD). The reaction does not form an unreacted Metal 2 solid on the Metal 1 or the Metal 1-Metal 2 Intermetallic. In the case of the embodiments described above, unreacted titanium is not formed on the aluminum layer or the titanium aluminide layer. In the reaction, the Metal 1 (aluminum) and the Metal 1-Metal 2 Intermetallic (titanium aluminide) are the only solids. The other reactant (titanium tetrachloride) and product (aluminum chloride) are gases during the reaction. Although the singular form of other reactant or other product is used, a plurality of other reactants may be used, or a plurality of other products may be formed. Because the other reactants and other product are gases, the unreacted portion of the other reactant and the other product may be easily removed. If diluents are used, they should also be gases during the reaction. A separate process step to remove unreacted reactants, which typically occurs with a sputter deposition process, is not needed. In addition, because the other reactant and product are not liquids or solids, particle and contamination problems are typically reduced compared to a sputter deposition process. The reaction typically occurs at the surface of a metal and not on insulating or dielectric layers. Therefore, the intermetallic may be formed in a self-aligned manner without the need for a separate patterning step.

Metal 1 can be any metal. In many semiconductor applications, metal 1 is copper or aluminum. The layer of Metal 1 may include small amounts of impurities. The other reactant includes Metal 2. Usually, the other reactant includes a metal halide or an organometallic compound. Because many metals etch with chlorine, the other reactant typically includes a metal chloride, a metal-chlorine halide or an organometallic compound with a chlorine radical that is attached to a metal atom. If the Metal 2 gas does not include any chlorine atoms, a chlorine-containing gas may be added, such as molecular chlorine. In semiconductor applications, the other reactant normally includes a transition element, and more specifically, a refractory metal, such at titanium, tungsten, tantalum, molybdenum, cobalt, and the like. In the embodiments of the Example 1, Metal 1 is aluminum and the other reactant is titanium tetrachloride. The selection of the other reactant may in part be determined by the Metal 1 and the fact that the other product needs to be a gas. In the embodiment of Example 1, the other reactant is titanium tetrachloride which reacts with the aluminum to form for aluminum trichloride (AlCl$_3$), which is a gas during the reaction (at the reacting conditions). Although specific materials are listed above with respect to Metal 1 and the other reactant, the specific materials listed are to be illustrative and not limiting.

The substrate should be at a temperature no higher than 700 degrees Celsius during the reaction. Above 700 degrees Celsius, undesired complications may arise. Above 550 degrees Celsius, a barrier layer typically degrades in performance (as a barrier layer) and is generally not desired. In the embodiment of Example 1, the substrate will normally be at a temperature no higher than 450 degrees Celsius during the reaction. Therefore, the reaction in the embodiment of Example 1 should not have the problems discussed within this paragraph.

In the foregoing specification, the invention has been described with reference to specific embodiments thereof. It will, however, be evident that various modifications and changes can be made thereto without departing from the broader spirit or scope of the invention as set forth in the appended claims. The specification and drawings are, accordingly, to be regarded in an illustrative rather than a restrictive sense.

What is claimed is:

1. A semiconductor device comprising:

a substrate;

a patterned first metal layer overlying the substrate, wherein the patterned first metal layer includes aluminum;

an insulating layer including an opening that overlies the patterned first metal layer;

a via structure that lies adjacent to the patterned first metal layer and lies at least partially within the opening, wherein:

the via structure includes a titanium-aluminum compound; and the via structure does not include a layer of elemental titanium; and a patterned second metal layer overlying the via structure.

2. The device of claim 1, wherein the via structure further comprises a barrier layer overlying the titanium-aluminum compound.

3. The device of claim 1, wherein:

the titanium-aluminum compound lies on the patterned first metal layer;

a titanium nitride layer lies on the titanium-aluminum compound and within the opening but does not overlie a top surface of the insulating layer;

a tungsten layer lies on the titanium nitride layer and within the opening; and the patterned second metal layer lies on the tungsten layer.

4. The device of claim 1, wherein:

each of the patterned first and second metal layers includes at least 95 percent aluminum and an impurity selected from a group consisting of silicon and copper; and the titanium-aluminum compound is titanium aluminide and is no more than 3000 angstroms thick.

5. The device of claim 1, wherein the patterned first metal layer, via structure, and patterned second metal layer are electrically connected to a region within the substrate.

6. The device of claim 1, further comprising a titanium nitride layer, wherein the titanium nitride layer lies at a wall of the opening of the insulating layer but does not overlie a top surface of the insulating layer.

\* \* \* \* \*